United States Patent
Kautz

(10) Patent No.: US 7,304,475 B2
(45) Date of Patent: Dec. 4, 2007

(54) MECHANISM FOR AND METHOD OF BIASING MAGNETIC SENSOR

(75) Inventor: David R. Kautz, Lenexa, KS (US)

(73) Assignee: Honeywell Federal Manufacturing & Technologies, Kansas City, MO (US)

( * ) Notice: Subject to any disclaimer, the term of this patent is extended or adjusted under 35 U.S.C. 154(b) by 155 days.

(21) Appl. No.: 11/251,306

(22) Filed: Oct. 14, 2005

(65) Prior Publication Data

US 2006/0066302 A1   Mar. 30, 2006

Related U.S. Application Data

(63) Continuation-in-part of application No. 10/394,330, filed on Mar. 25, 2003, now abandoned.

(51) Int. Cl.
*G01R 33/02* (2006.01)
*G01R 35/00* (2006.01)

(52) U.S. Cl. .................. 324/244; 324/202; 324/260

(58) Field of Classification Search ........... 324/202, 324/207.2, 207.21, 244, 249, 251, 252, 260; 338/32 R, 32 H; 360/318
See application file for complete search history.

(56) References Cited

U.S. PATENT DOCUMENTS 5,896,028 A * 4/1999 Arai .................. 324/117 H
6,028,427 A * 2/2000 Kawase .................. 324/249
6,194,897 B1 * 2/2001 Fukunaga .............. 324/255
6,879,153 B2 * 4/2005 Kudo et al. ............ 324/260

FOREIGN PATENT DOCUMENTS

| JP | 405172921 A | * | 7/1993 |
| JP | 409126780 A | * | 5/1997 |
| JP | 2002365350 A | * | 12/2002 |

* cited by examiner

*Primary Examiner*—Reena Aurora
*Assistant Examiner*—Kenneth J Whittington
(74) *Attorney, Agent, or Firm*—Hovey Williams LLP

(57) ABSTRACT

A magnetic sensor package having a biasing mechanism involving a coil-generated, resistor-controlled magnetic field for providing a desired biasing effect. In a preferred illustrated embodiment, the package broadly comprises a substrate; a magnetic sensor element; a biasing mechanism, including a coil and a first resistance element; an amplification mechanism; a filter capacitor element; and an encapsulant. The sensor is positioned within the coil. A current applied to the coil produces a biasing magnetic field. The biasing magnetic field is controlled by selecting a resistance value for the first resistance element which achieves the desired biasing effect. The first resistance element preferably includes a plurality of selectable resistors, the selection of one or more of which sets the resistance value.

14 Claims, 6 Drawing Sheets

MECHANISM FOR AND METHOD OF BIASING MAGNETIC SENSOR

RELATED APPLICATIONS

The present application is a continuation-in-part of earlier-filed U.S. nonprovisional patent application titled "MECHANISM FOR AND METHOD OF BIASING MAGNETIC SENSOR", Ser. No. 10/394,330, filed Mar. 25, 2003 now abandoned. The identified earlier-filed application is hereby incorporated by reference into the present application.

FEDERALLY SPONSORED RESEARCH OR DEVELOPMENT PROGRAM

The present invention was developed with support from the U.S. government under Contract No. DE-AC04-01AL66850 with the U.S. Department of Energy. Accordingly, the U.S. government has certain rights in the present invention.

BACKGROUND OF THE INVENTION

1. Field of the Invention

The present invention relates broadly to the field of magnetic sensors and to techniques for biasing magnetic sensors. More particularly, the present invention concerns a magnetic sensor package comprising a magnetic sensor element biased by a magnetic field produced by a current carried on a coil of electrically conductive wire and controlled by a selected one or more resistors from a plurality of selectable resistors to achieve a desired biasing effect, wherein at least the magnetic sensor element and the coil are protectively housed within an encapsulant.

2. Description of the Prior Art

Magnetic sensors are used in a variety of applications, including, for example, current sensing, linear or rotary motion detection, wheel speed sensing, and media (e.g., inks, currency) detection. It is often necessary or desirable to bias the magnetic sensor to, for example, provide a reference or set a condition of operation. A well-known prior art technique for biasing the magnetic sensor involves repositioning a permanent magnet in close proximity to the magnetic sensor until the desired degree of bias or biasing effect is achieved, whereafter the permanent magnet is permanently affixed in the corresponding position.

Unfortunately, this and other prior art biasing techniques suffer from a number of problems and disadvantages, including, for example, that the final position of the permanent magnet is directly related to and dictated by the required bias. This can be particularly problematic when the necessary position of the permanent magnet is already occupied by another component, or when the necessary position is beyond the bounds of the sensor's housing or allotted space.

Furthermore, because the permanent magnet must be physically repositioned, initial biasing can only be performed by a human or by a robot capable of moving the permanent magnet with the necessary degree of care and precision. This can be undesirably inefficient and expensive.

Additionally, because the permanent magnet must be accessible in order to be repositioned, both the magnetic sensor and the permanent magnet cannot be provided in a single sealed housing. As a result, the components of the magnetic sensor are exposed to a potentially damaging ambient environment and hazards of use, including dust and moisture, that can adversely affect performance.

Due to the above-identified and other problems and disadvantages in the art, a need exists for an improved mechanism for or method of biasing a magnetic sensor.

SUMMARY OF THE INVENTION

The present invention overcomes the above-described and other problems and disadvantages in the prior art with a magnetic sensor package having a biasing mechanism involving a coil-generated, resistor-controlled magnetic field for providing a desired biasing effect. In a preferred illustrated embodiment, the package broadly comprises a substrate; a magnetic sensor element; a biasing mechanism; an amplification mechanism; a filter capacitor element; and an encapsulant.

The substrate is substantially conventional, and presents a first side and a second side. Where board space is a consideration, certain components of the package can be located on the first side and other components can be located on the second side, thereby allowing for a minimized footprint. Electrically conductive circuit traces are applied to the substrate to electrically interconnect the other components of the package.

The magnetic sensor element is substantially conventional and is operable to sense magnetic phenomena. The biasing mechanism is adapted to bias the sensor by a necessary or desirable degree. The biasing mechanism includes a coil and a first resistance element. The coil is a coated air coil of electrically conductive wire, and is adapted to produce a biasing magnetic field when a current is carried on the coil. The sensor is positioned substantially within the coil and therefore substantially within the biasing magnetic field. The first resistance element cooperates with the coil to achieve the desired biasing effect or otherwise set a desired characteristic of the biasing magnetic field. The first resistance element is preferably embodied in a surface-mount chip of selectable resistors wherein selection of one or more of the selectable resistors sets a resistance value and thereby controls the biasing effect.

The amplification mechanism includes both an amplifier element and a second resistance element. The amplifier operates to amplify an output signal of the sensor by a necessary or desirable degree or gain factor. The second resistance element cooperates with the amplifier to set the gain factor. The second resistance element may be embodied in and operate similar to the surface-mount chip of selectable resistors described above.

The filter capacitor element is adapted to filter input voltage lines to both the sensor and the amplification mechanism. The encapsulant cooperates with the substrate to protectively house or enclose at least the sensor and the coil.

Thus, it will be appreciated that the present invention provides a number of substantial advantages over the prior art, including, for example, that positioning of the bias-controlling first resistance element is completely independent of the biasing effect, meaning it can be positioned anywhere convenient or otherwise desirable. By contrast, in prior art biasing, the position of the permanent magnet used to control the biasing effect is directly related to and dictated by the biasing effect.

Furthermore, because the first resistance element need not be physically repositioned to achieve the desired biasing effect, the present invention is more agreeable to being computer-controlled or otherwise automated whereby, for example, a computer selects one or more of the first resistors from the plurality of selectable resistors to achieve the desired biasing effect.

Additionally, again because no repositioning of components is involved in biasing, the encapsulant can permanently cover at least some of the package's components, including the sensor and the coil, to protect them from the potentially damaging ambient environment and hazards of use.

Additionally, where board space is a consideration, certain of the components can be grouped and placed on the first side of the substrate and others of the components can be placed on the second side of the substrate.

These and other important features of the present invention are more fully described in the section titled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein.

DETAILED DESCRIPTION OF A PREFERRED EMBODIMENT

Figure 1:
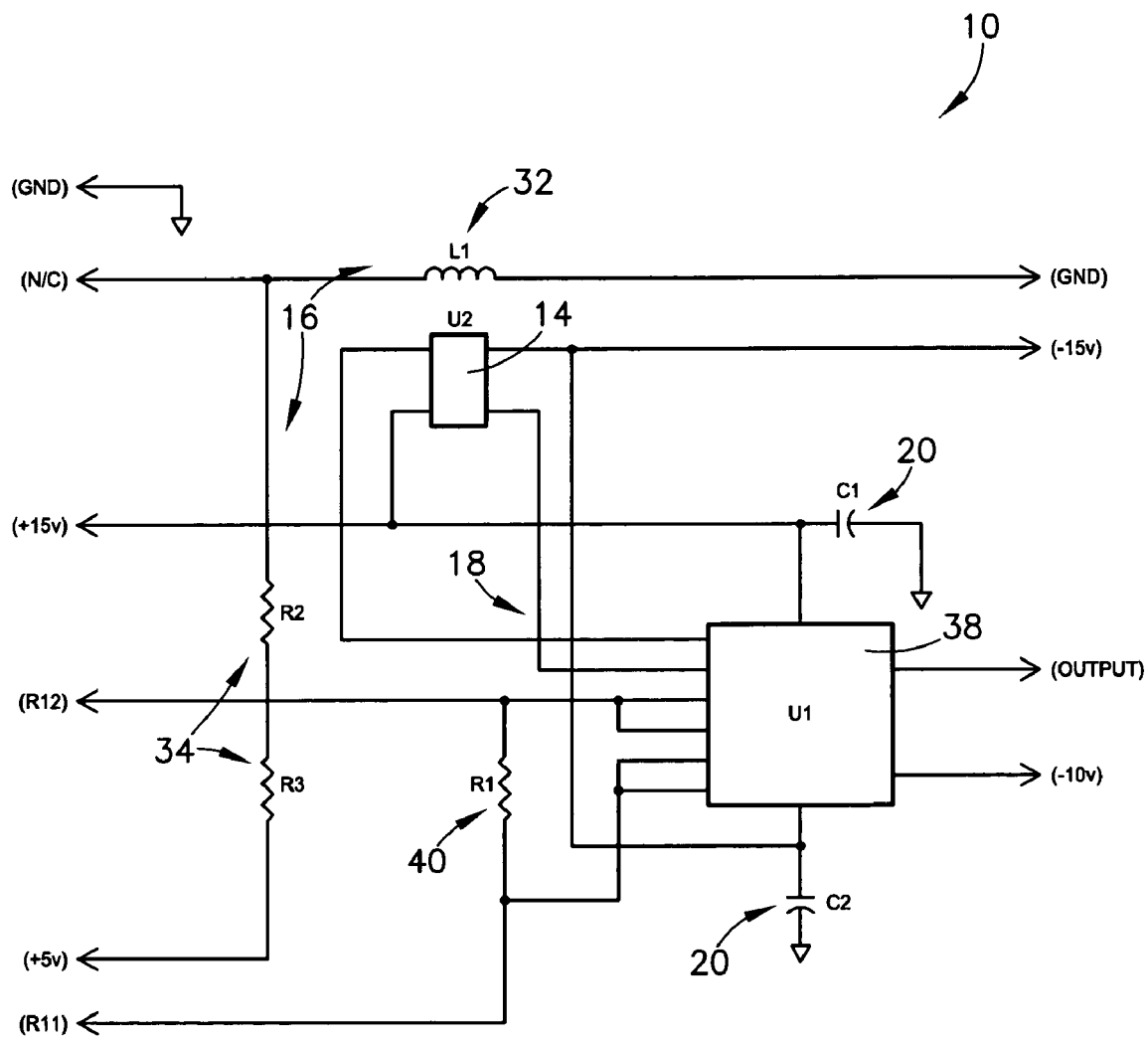
FIG. 1 is a circuit schematic of a preferred embodiment of the magnetic sensor of the present invention.

Referring to FIGS. 1-4, a magnetic sensor package 10 is shown constructed in accordance with a preferred embodiment of the present invention. The package 10 is biased by a coil-generated, resistor-controlled magnetic field, and is otherwise adapted to detect a magnetic phenomenon and to produce an amplified output signal corresponding thereto. In a preferred illustrated embodiment, the package 10 broadly comprises a substrate 12; a magnetic sensor element 14; a biasing mechanism 16; an amplification mechanism 18; a filter capacitor element 20; and an encapsulant 22.

The substrate 12 is constructed from one or more commonly available materials, such as, for example, ceramic or printed circuit board (PCB) materials, and, in a substantially conventional manner, provides mounting and structural support for the other components of the package 10. As illustrated, the substrate 12 presents a first side 24 (see particularly FIG. 2) and a second side 26 (see particularly FIG. 3). To minimize the substrate's footprint, the magnetic sensor element 14, portions of the biasing mechanism 16, portions of the amplification mechanism 18, and the encapsulant 22 are mounted or otherwise located on the first side 24 of the substrate 12, while other portions of the biasing mechanism 16, other portions of the amplification mechanism 18, and the filter capacitor element 20 are mounted or otherwise located on the second side 26 of the substrate 12. The first and second sides 24,26 may be electrically interconnected using edge connectors 28 or vias or a combination thereof. The present invention is not, however, limited to this arrangement, and may instead be configured, for example, such that all of the package's components are mounted on the same side of the substrate 12. A network of electrically conductive circuit traces is applied to the substrate 12 to electrically interconnectthe other components of the package 10.

The magnetic sensor element 14 is commonly available in chip form from a variety of suppliers, and, in a substantially conventional manner, senses a magnetic phenomenon. As mentioned, the sensor 14 is located on the first side of the substrate 12.

The biasing mechanism 18 is adapted to bias the sensor 14 by a necessary or desirable degree to, for example, provide a reference or set a condition of the sensor's operation. The biasing mechanism 18 includes a coil 32 and the first resistance element 34. The coil 32 is a coated air coil of electrically conductive wire, and is adapted to produce a biasing magnetic field when an electric current is carried on the coil 32. The sensor 14 is positioned substantially within the coil 32 and therefore substantially within the biasing magnetic field. As such, the coil 32 is also located on the first side of the substrate 12.

The first resistance element 34 is electrically associated with the coil 32 and cooperates therewith to achieve a desired biasing effect or otherwise set a desired characteristic of the biasing magnetic field. The first resistance element 34 may provide a substantially fixed resistance value, but preferably provides a substantially selectable or otherwise adjustable resistance value. As illustrated, for example, the first resistance element 34 is embodied in a plurality of selectable first resistors provided in the form of one or more commonly available surface-mount chips of selectable resistors. Selection of one or more of the plurality of selectable first resistors sets the resistance value and thereby controls the biasing effect of the biasing magnetic field. Alternatively, the first resistance element 34 may be embodied in a potentiometer which also provides a similarly selectable resistance value. The first resistance element 34 is located on the second side of the substrate 12.

Figure 3:
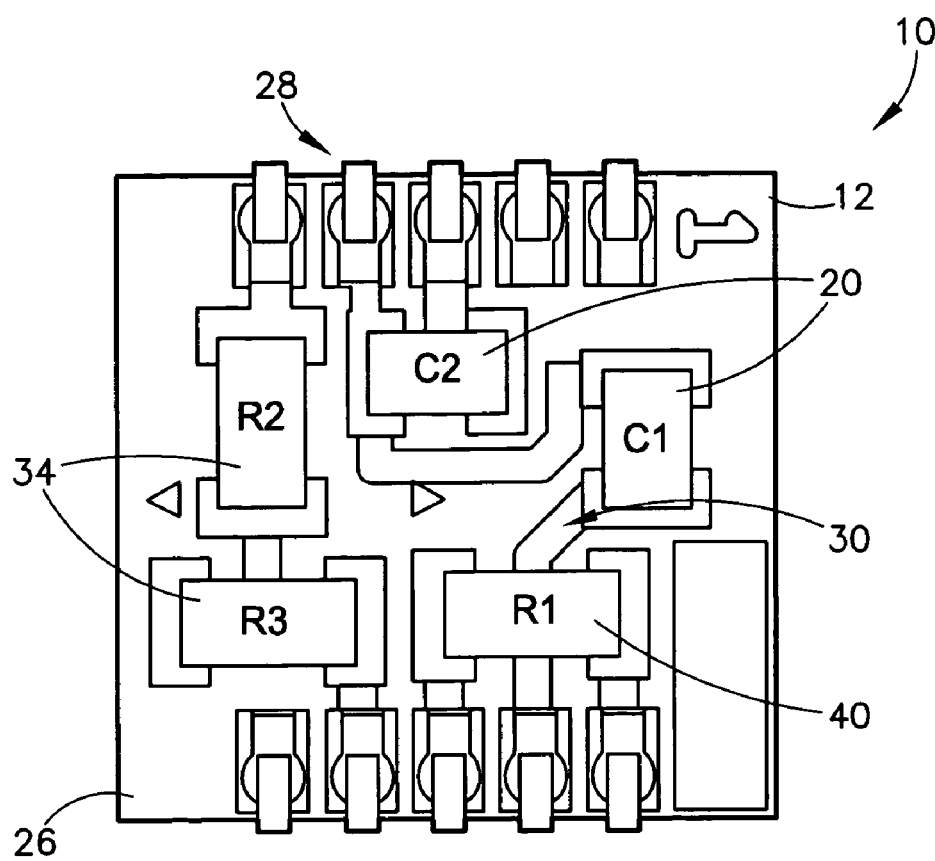
FIG. 3 is a bottom view of the magnetic sensor of FIG. 1.
Figure 4:
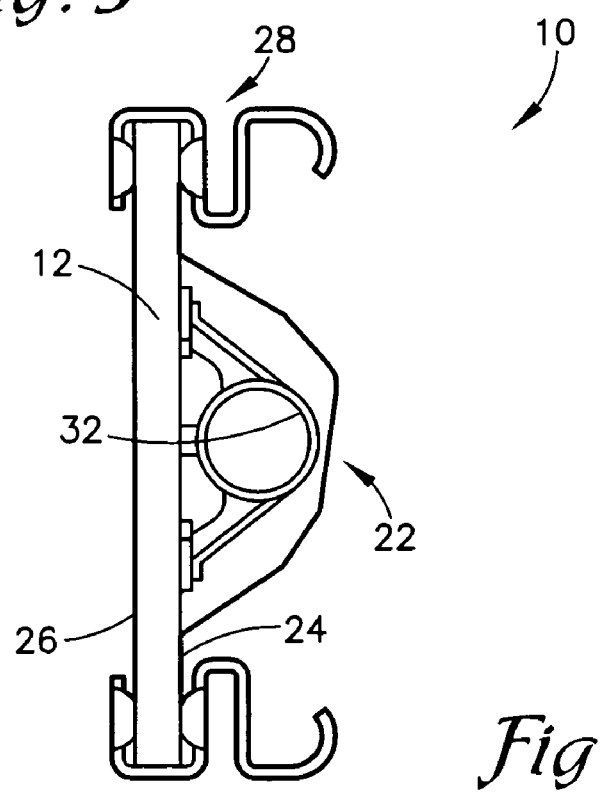
FIG. 4 is an elevation view of the magnetic sensor of FIG. 1.

The amplification mechanism 16 includes both an amplifier element 38 and a second resistance element 40, both of which are also commonly available in surface-mount package form or in chip form from a variety of suppliers. Note that FIG. 3 illustrates the resistance element 40 in chip form. The amplifier 38 operates, in a substantially conventional manner, to amplify an output signal of the sensor 14 by a necessary or desirable degree or gain factor. The amplifier 38 is located on the first side of the substrate 12.

The second resistance element 40 is electrically associated with the amplifier element 38 and cooperates therewith to set the gain factor. The second resistance element 40 may provide a substantially fixed resistance value, but preferably provides a substantially selectable or otherwise adjustable resistance value. Similar to the first resistance element 34, the second resistance element 40 is illustrated as being embodied in a plurality of first resistors provided in the form of one or more commonly available surface-mount chips of selectable second resistors. Selection of one or more of the plurality of second resistors sets the resistance value and thereby determines the gain factor. The second resistance element 40 is located on the second side of the substrate 12.

The filter capacitor element 20 is a commonly available component, and is, in a substantially conventional manner, adapted to filter input voltage lines to both the sensor 14 and the amplification mechanism 16. As mentioned, the filter capacitor element 20 is located on the second side of the substrate 12.

The encapsulant 22 cooperates with the substrate 12 to protectively house or enclose the sensor 14 and the coil 32.

The encapsulant 22 may be, for example, a commonly available epoxy or other "glob-top" material analogous to a potting compound, wherein the encapsulant 22 is "globbed" onto and over the coil 32. Thus covered, these components are effectively protected against potentially damaging ambient environment or hazards of use. Use of the glob-top material, which is non-removable, is possible because no repositioning of the sensor 14 or the coil 32 is performed during biasing. Alternatively, the encapsulant 22 could take the form of a ceramic cover which is either removably or non-removably secured over at least the sensor 14 and the coil 32.

Figure 5:
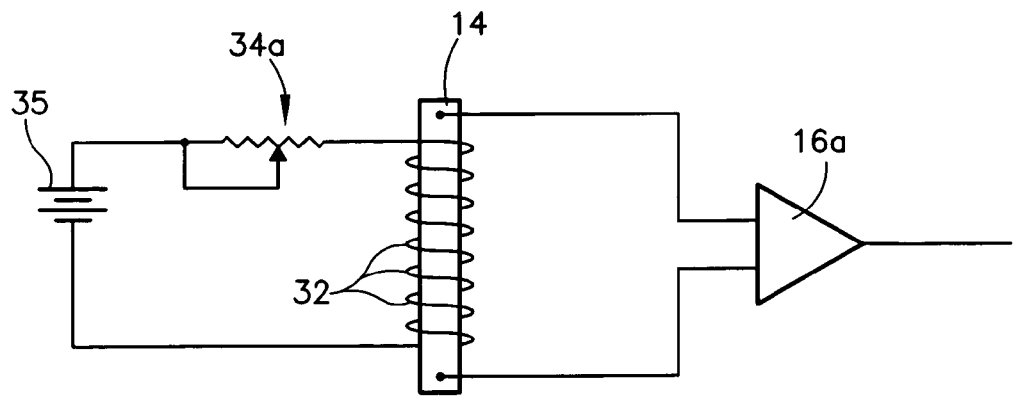
FIG. 5 is a circuit schematic of an alternative embodiment of the magnetic sensor of the present invention.

An alternative embodiment of a circuit of the sensor package 10 is illustrated in FIG. 5, demonstrating more clearly the interaction between a first resistance element 34a, the coil 32, the sensor 14, and an amplification mechanism 16a. The first resistance element 34a in this embodiment is a potentiometer connected in series with a power source 35 and the coil 32. The coil 32 is connected to the amplification mechanism 16a, which in this embodiment is an operational amplifier. The resistance element 34a cooperates with the coil 32 in a manner similar to the resistance element 34 described above, wherein the resistance element 34a is adjusted to regulate a current flow through the coil 32, which in turn generates a biasing magnetic field. The amplification mechanism 16a cooperates with the sensor 14 in a manner similar to the amplification mechanism 16, wherein the amplification mechanism 16a detects an electrical output of the sensor 14 and reproduces the output at a greater magnitude.

Figure 6:
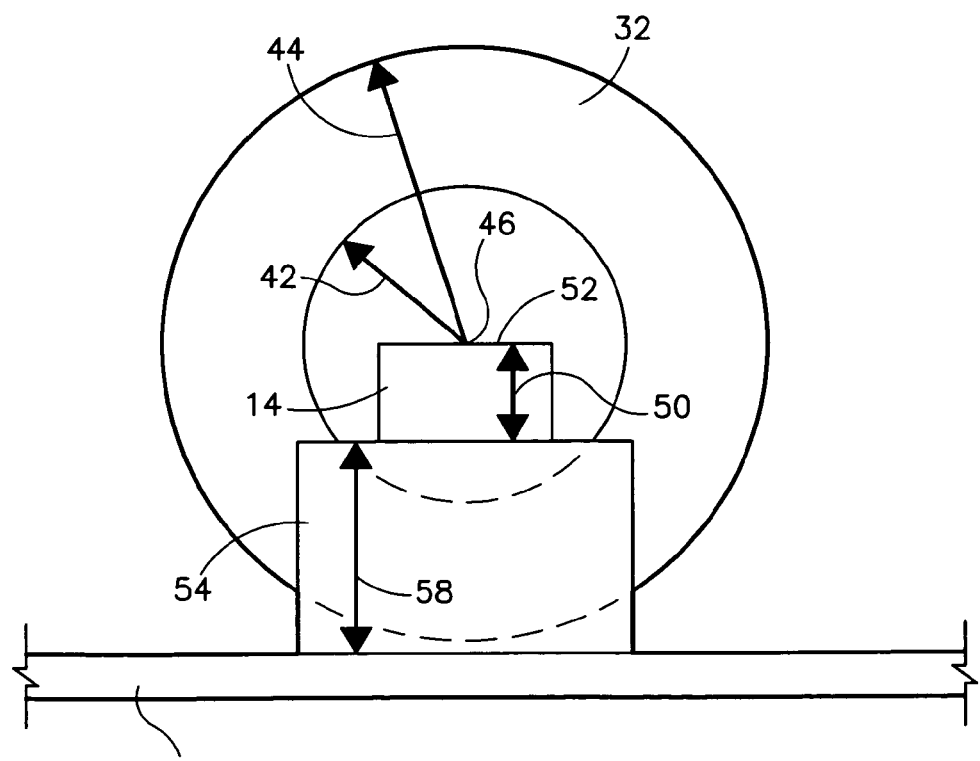
FIG. 6 is an elevation view of a coil of wire and magnetic sensor element of the magnetic sensor of FIG. 1.
Figure 7:
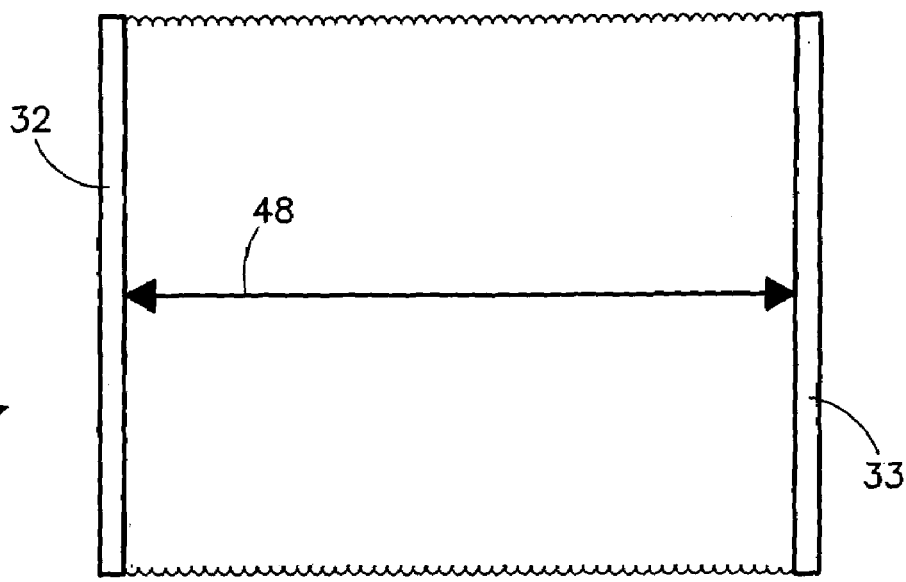
FIG. 7 is a plan view of the coil of FIG. 6.

The sensor 14 and biasing mechanism 18 are illustrated in greater detail in FIGS. 6 and 7, wherein FIG. 6 presents an end elevation view of the sensor 14 and the coil 32, and FIG. 7 presents a top view of the coil 32. Referring initially to FIG. 6, the coil 32 presents an inner radius 42 and an outer radius 44. The inner radius 42 represents the distance from a radially-central axis 46 (normal to the figure) of the coil 32 to an innermost winding or group of windings of the coil 32, and the outer radius 44 represents the distance from the radially-central axis 46 of the coil 32 to an outermost winding or group of windings of the coil 32. The illustrated inner radius 42 is approximately sixteen thousandths of an inch while the illustrated outer radius 44 is approximately thirty-five thousandths of an inch. As illustrated in FIG. 7, a length 48 of the coil 32 is approximately eighty thousandths of an inch.

It should be noted that the size and shape of the coil 32 as described and illustrated herein may vary. The inner radius 42, for example, is preferably from ten to twenty thousandths of an inch and the outer radius 44 is preferably from twenty to fifty thousands of an inch. Those skilled in the art will recognize that the size of the coil 32 may depart substantially from these ranges, according to the requirements of a particular application, without departing from the scope of the present teachings.

Figure 2:
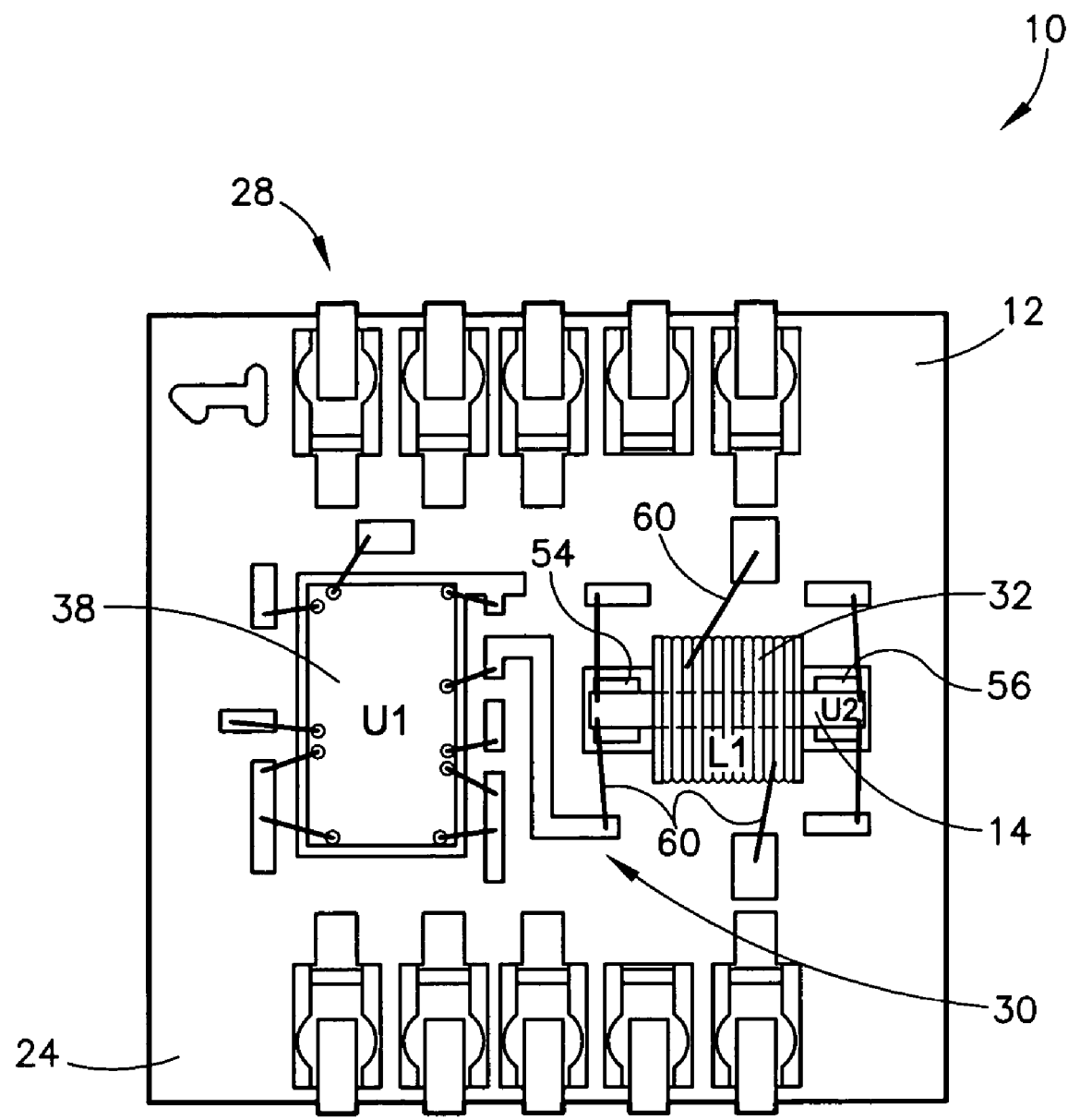
FIG. 2 is a plan view of the magnetic sensor of FIG. 1.

The illustrated sensor 14 is an elongated, rectangular-shaped bare die magnetic sensor, as best seen in FIGS. 2 and 5. A cross section of the sensor 14 is illustrated in FIG. 6, wherein the cross section of the sensor 14 has a thickness 50 of approximately ten thousandths of an inch. The size and shape of the sensor 14 as described and illustrated herein are exemplary in nature. It should be noted that sensors of various sizes and shapes may be employed without departing from the scope of the present teachings. For example, the thickness 50 of the sensor 14 is preferably from five to twenty thousandths of an inch and a width is preferably from five to twenty-five thousandths of an inch.

As illustrated in FIG. 6, the radially-central axis 46 of the coil 32 corresponds with a center of a top surface 52 of the magnetic sensor 14. The active portion of the sensor 14 substantially corresponds with the top surface 52, and may be defined by a depth of only a few Angstroms. Placing the sensor 14 so that the top surface 52 is centered along the axis 46 of the coil 32 minimizes the amount of current necessary to bias the sensor 14. For example, if the coil 32 consists of eighty-five turns of forty-one AWG wire, as little as seventeen milliamps of current may be required to bias the sensor 14.

The sensor 14 rests on two posts 54,56 (see FIG. 2), wherein a first post 54 supports a first end of the sensor 14 and a second post 56 supports a second end of the sensor 14. The first post 54 is illustrated in FIG. 6, wherein the second post 56 is opposite the first post and hidden from view. The posts 54,56 are preferably made of an electrically insulating material that is not magnetically responsive, such as aluminum oxide ($Al_2O_3$) or a similar material. The posts 54,56 are fixedly secured to the substrate 12 on either end of the coil 32, such that the posts 54,56 lie on a line that is approximately parallel with the radially-central axis 46 of the coil 32. The height 58 of each of the posts 54,56 thus is preferably selected to support the sensor 14 so that the top surface 50 of the sensor 14 corresponds to the axis 46, as explained above. If the outer radius 44 of the coil 32 is thirty-five thousandths of an inch, and the sensor 14 is ten thousandths of an inch thick, for example, the height 58 of each of the posts 54,56 would be approximately twenty-five thousandths of an inch.

As illustrated in FIG. 2, the sensor 14 and the coil 32 are electrically connected to various points in one or more circuits of the substrate 12 via one or more wire leads 60. As illustrated, four leads are connected to the sensor 14 and two leads are connected to the coil 32. The length of each lead connected to the coil 32 is preferably about 0.25 inches with approximately 0.225 inches prepared for soldering. As explained above, the encapsulant 22 cooperates with the substrate 12 to protectively house or enclose the sensor 14 and the coil 32. The encapsulant 22 also may completely or partially house and protect the wire leads 60.

Figure 8:
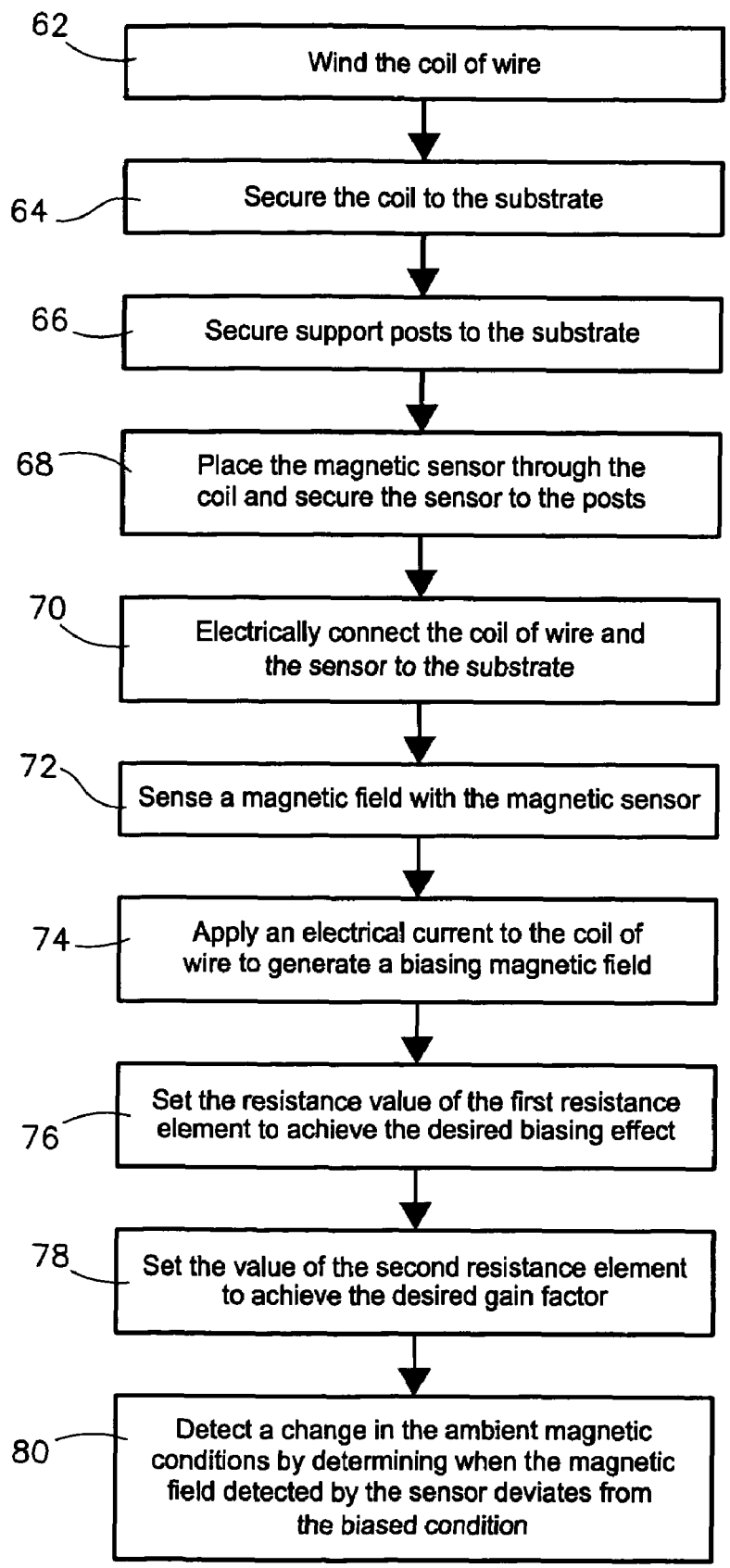
FIG. 8 is a flowchart of steps involved in the assembly and use of the magnetic sensor of FIG. 1.

Due to the small nature of the sensor 14 and the coil 32, one or more microelectronic manufacturing processes may be required to assemble the sensor 14, coil 32, and related parts. FIG. 8 illustrates a flowchart of steps involved in the assembly and use of the magnetic sensor package 10. The coil 32 is first wound, as depicted in block 62. An exemplary coil includes eighty-five turns of forty-one AWG wire, but various types of wire may be used to create a coil of various sizes without departing from the scope of the present teachings. The coil 32 is preferably wound around a bobbin 33, and may be wound by hand or by machine. The coil 32 is then secured to the substrate 12, as depicted in block 64. The coil 32 may be secured to the substrate 12 using an epoxy, such as an epoxy especially made for use in microelectronic manufacturing processes. With the coil 32 in place, the posts 54,56 are secured to the substrate 12, as depicted in block 66, wherein the posts 54,56 are also secured to the substrate 12 with an epoxy.

The sensor 14 is then placed through the coil 32 and secured to the posts 54,56, as depicted in block 68. The leads 60 of the sensor 14 and the coil 32 are then electrically connected to the substrate 12, as depicted in block 70. With the leads 60 thus connected, the sensor 14 and the coil 32 form part of the electrical circuit illustrated in FIG. 1. The resistance elements 34 and 40 can then be set to achieve the proper operating conditions of the magnetic sensor package 10. An ambient magnetic field is detected with the sensor 14, as depicted in block 72, and a current is then applied to the coil 32 to produce a biasing magnetic field, as depicted in block 74. The resistance value of the first resistance element 34 is then set to achieve the desired biasing effect from the biasing magnetic field, as depicted in block 76. This may be done, for example, by selecting one or more resistors from a plurality of selectable resistors, or manipulating a variable resistor. The desired biasing effect may be to "zero" the output of the sensor 14 under normal operating conditions such that a change in the ambient magnetic conditions would cause the sensor to deviate from zero. This is but one example, and it will be appreciated that the desired biasing effect may be to set the output of the sensor to 0.25 volts, 0.5 volts, or another value, wherein a change in the ambient magnetic conditions would cause the sensor to deviate from the value. As used herein, "ambient magnetic conditions" refer to magnetic fields and other magnetic phenomena that are detected by the magnetic sensor.

Thereafter, if not already done, the resistance value of the second resistance element 40 is set to achieve the desired gain factor, as depicted in block 78. The setting of these resistance values through the selection of resistors may be done by a computer or other automated mechanism. Finally, a change in the ambient magnetic conditions is detected and measured by determining when the magnetic field detected by the sensor 14 deviates from the biased condition, as depicted in block 80.

From the preceding description, it will be appreciated that the present invention provides a number of substantial advantages over the prior art, including, for example, that positioning of the bias-controlling first resistance element 34 is completely independent of the biasing effect, meaning it can be positioned anywhere convenient or otherwise desirable. By contrast, in prior art biasing, the position of the permanent magnet used to control the biasing effect was directly related to and dictated by the biasing effect.

Furthermore, because the first resistance element 34 need not be physically repositioned to achieve the desired biasing effect, the present invention is more agreeable to being computer-controlled or otherwise automated, whereby, for example, a computer selects one or more of the first resistors from the plurality of selectable resistors to achieve the desired biasing effect.

Additionally, again because no repositioning of components is involved in biasing, the encapsulant can be placed over at least some of the package's components, including the sensor 14 and the coil 32, to protect them from an ambient environment and hazards of use.

Additionally, where board space is a consideration, certain of the components can be grouped and placed on the first side 24 of the substrate 12 and others of the components can be placed on the second side 26 of the substrate 12.

Although the invention has been described with reference to the preferred embodiments illustrated in the attached drawings, it is noted that equivalents may be employed and substitutions made herein without departing from the scope of the invention as recited in the claims. It will be appreciated, for example, that, as mentioned, all of the components can be located on a same side of the substrate such that both sides of the substrate are not be utilized. Furthermore, the posts 54,56, sensor 14, and coil 32 may be secured to the substrate via a laminate chip-on-board technology.

Having thus described the preferred embodiment of the invention, what is claimed as new and desired to be protected by Letters Patent includes the following:

1. A method of biasing a magnetic sensor, the method comprising the steps of:

placing a bare die magnetic sensor within a coil of electrically conductive wire such that the coil substantially surrounds the sensor, the coil presenting an inner radius of between ten and twenty thousandths of an inch and an outer radius of between twenty and fifty thousandths of an inch;

fixedly securing the coil to a substrate;

fixedly securing a pair of electrically non-conductive posts to the substrate;

fixedly securing the sensor to the pair of posts such that the sensor is separated from the substrate by a space;

applying an electrical current through the coil of wire to generate a biasing magnetic field that opposes an ambient magnetic field detected by the sensor, and manipulating the electrical current to create a desired biased condition; and detecting changes in the ambient magnetic field by determining when the magnetic field detected by the sensor deviates from the biased condition.

2. The method as set forth in claim 1, further comprising the step of applying an epoxy to the sensor and the coil to secure each in place and to protectively encapsulate at least a portion of each.

3. The method as set forth in claim 1, further comprising the step of associating a variable resistor with the coil of wire so that the coil may be selectively energized by manipulating the variable resistor.

4. The method as set forth in claim 1, further comprising the step of selecting the bare die magnetic sensor such that the sensor is elongated and presents a cross section that is between five and fifteen thousandths of an inch in height and between five and twenty-five thousandths of an inch wide.

5. The method as set forth in claim 1, further comprising the step of selecting the coil of wire such that the coil has between fifty and one-hundred turns, presents an inner radius of between ten and twenty thousandths of an inch, and presents an outer radius of between twenty and fifty thousandths of an inch.

6. The method as set forth in claim 5, further comprising the step of selecting the coil of wire such that the wire is within the range of thirty-five to forty-five AWG.

7. The method as set forth in claim 1, further comprising the step of manipulating the electrical current so that the biasing magnetic field substantially cancels the ambient magnetic field, wherein the resulting magnetic field detected by the sensor is substantially equal to zero.

8. The method as set forth in claim 7, further comprising the step of detecting changes in the ambient magnetic field by determining when the resultant magnetic field detected by the sensor deviates from zero.

9. The method as set forth in claim 1, further comprising the step of selecting the posts such that they support the sensor so that the sensor is spaced from the substrate a distance of between fifteen and thirty-five thousandths of an inch.

10. The method as set forth in claim 1, further comprising the step of selecting the posts such that they support the sensor so that a top surface of the sensor substantially corresponds to a radially-central axis of the coil.

11. A method of biasing a magnetic sensor, the method comprising the steps of:
- winding a coil of wire around a bobbin so that the coil has between forty and one-hundred turns, an inner radius of between ten and twenty thousandths of an inch, and an outer radius of between twenty and fifty thousandths of an inch;
- fixedly securing the bobbin to the printed circuit board;
- fixedly securing two electrically nonconductive posts to a surface of a printed circuit board, wherein a first post is placed at a first end of the coil and a second post is placed at a second end of the coil, and wherein each of the posts extends from fifteen to thirty-five thousandths of an inch above the surface of the printed circuit board;
- placing an elongated bare die magnetic sensor in the bobbin so that the sensor rests upon the posts and is substantially surrounded by the coil, wherein the posts support the sensor so that the sensor is approximately centered in the bobbin and a top surface of the sensor corresponds to a radially-central axis of the coil of wire, and wherein a cross section the sensor is between five and fifteen thousandths of an inch thick and between five and twenty-five thousands of an inch wide;
- electrically connecting the coil of wire and the sensor to conductive pads of the printed circuit board, thereby introducing the coil of wire and the sensor into at least one circuit of the printed circuit board;
- electrically connecting a variable resistor in series with the coil of wire so that an electrical current flow through the coil of wire may be regulated by manipulating the variable resistor;
- applying an epoxy to secure and partially encase and protect the coil, the posts, and the sensor;
- sensing an ambient magnetic field with the magnetic sensor;
- applying an electrical current through the variable resistor and the coil of wire to generate a biasing magnetic field that opposes the ambient magnetic field sensed by the sensor, and manipulating the variable resistor to regulate the electrical current until the magnetic field sensed by the magnetic sensor is equal to zero; and
- detecting a change in the ambient magnetic field by determining when the magnetic field sensed by the sensor deviates from zero.

12. A magnetic sensor package comprising:
- a substrate;
- a coil of electrically conductive wire fixedly secured to the substrate, wherein the coil presents an inner radius of between ten and twenty thousands of an inch and an outer radius of between twenty and fifty thousands of an inch;
- a bare die magnetic sensor placed within the coil of wire such that the coil substantially surrounds the sensor; and
- a pair of electrically non-conductive posts fixedly secured to the substrate and to the sensor such that the sensor is separated from the substrate by a space,
- wherein a top surface of the sensor corresponds to a radially-central axis of the coil of wire.

13. The magnetic sensor package as set forth in claim 12, wherein the bare die magnetic sensor is elongated and presents a cross section that is between five and fifteen thousandths of an inch in height and between five and twenty-five thousandths of an inch wide.

14. A magnetic sensor package comprising:
- a printed circuit board;
- a pair of electrically nondonductive posts fixedly secured to the printed circuit board;
- an elongated bare die magnetic sensor fixedly secured to the pair of posts such that the sensor is separated from teh printed circuit board by a space, wherein the magnetic sensor presents a cross section that is between five and fifteen thousandths of an inch in height and between five and twenty-five thousandths of an inch wide;
- a coil of electrically conductive wire substantially surrounding the sensor and fixedly secured to the printed circuit board, wherein the coil has between forty and sixty turns, an inner radius of between ten and twenty thousandths of an inch, and an outer radius of between twenty and fifty thousandths of an inch, and wherein a radially-central axis of the coil corresponds to a center of a top surface of the sensor; and
- an encapsulant adapted to substantially cover and protect the sensor and the coil.

* * * * *